United States Patent [19]
Gonzalez

[11] Patent Number: 5,937,287
[45] Date of Patent: Aug. 10, 1999

[54] FABRICATION OF SEMICONDUCTOR STRUCTURES BY ION IMPLANTATION

[75] Inventor: Fernando Gonzalez, Boise, Id.

[73] Assignee: Micron Technology, Inc., Boise, Id.

[21] Appl. No.: 08/897,364

[22] Filed: Jul. 22, 1997

[51] Int. Cl.$^6$ .................... H01L 21/76; H01L 21/8238; H01L 21/8249

[52] U.S. Cl. .................. 438/220; 438/221; 438/224; 438/524; 257/397

[58] Field of Search .................... 438/218, 219, 438/220, 221, 223, 224, FOR 217, 421, 524, 525, 919; 257/397–398, 399, 624

[56] References Cited

U.S. PATENT DOCUMENTS

| | | | |
|---|---|---|---|
| 4,466,178 | 8/1984 | Soclof | 438/218 |
| 4,653,177 | 3/1987 | Lebowitz et al. | 438/224 |
| 4,808,543 | 2/1989 | Parrillo | 438/218 |
| 5,015,594 | 5/1991 | Chu et al. | 437/31 |
| 5,137,837 | 8/1992 | Chang et al. | 438/221 |
| 5,260,226 | 11/1993 | Sawada et al. | 438/224 |
| 5,436,174 | 7/1995 | Baliga et al. | 438/220 |
| 5,643,822 | 7/1997 | Furukawa et al. | 438/224 |
| 5,759,881 | 6/1998 | Manning | 438/218 |
| 5,759,885 | 6/1998 | Son | 438/224 |
| 5,780,353 | 7/1998 | Omid-Zohoor | 438/524 |
| 5,789,288 | 8/1998 | Palieri | 438/220 |
| 5,795,801 | 8/1996 | Lee | 438/222 |
| 5,827,763 | 10/1998 | Gardner et al. | 438/224 |
| 5,874,346 | 2/1999 | Fulford et al. | 438/221 |

*Primary Examiner*—Chandra Chaudhari
*Assistant Examiner*—David S Blum

*Attorney, Agent, or Firm*—Workman, Nydegger & Seeley

[57] ABSTRACT

The present invention relates to the formation of trench isolation structures that isolate active areas and a preferred doping in the fabrication of a CMOS device with a minimized number of masks. Ions of a P-type dopant are implanted into a semiconductor substrate having therein a P-well and an N-well. Each of the N-well and P-well has therein a trench. The ions of the P-type dopant are implanted beneath each of the trenches in the P-well and the N-well to create a first P-type dopant concentration profile in the semiconductor substrate, wherein the P-well and the N-well are substantially unimplanted by the ions of the P-type dopant in active areas adjacent to the respective trenches therein. A second implanting ions of a P-type dopant is made into the semiconductor substrate. The second implanting is beneath each of the trenches in the P-well and the N-well to form a second P-type dopant concentration profile. The second implanting is also though one or more barrier layers on the semiconductor substrate into the P-well and the N-well in active areas adjacent to each of the trenches in the P-well and the N-well to form a third P-type dopant concentration profile, wherein the second and third P-type dopant concentration profiles are simultaneously formed. Next, the respective trenches in each of the P-well and N-well are substantially filled with a dielectric material. Ions of an N-type dopant are then implanted into the N-well, wherein the P-well is substantially unimplanted by the ions of the N-type dopant, and wherein the N-well has therein a concentration of the N-type dopant that is substantially greater than the P-type dopant therein. The N-type dopant dopes active areas in the N-well so as to achieve a desired threshold voltage.

70 Claims, 2 Drawing Sheets

FABRICATION OF SEMICONDUCTOR STRUCTURES BY ION IMPLANTATION

BACKGROUND OF THE INVENTION

1. The Field of the Invention

The present invention relates to fabrication of semiconductor structures. More particularly, the present invention relates to formation of semiconductor structures by ion implantation techniques. In particular, the inventive method disclosed herein is applied to formation of a complementary metal oxide semiconductor structure that includes formation of ion-implant enhanced isolation trenches for electrical isolation of active areas. The invention is applicable to formation of semiconductor structures that require two dopants that are different or opposite in conductivity enhancement of semiconductor silicon.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the microelectronics industry, the process of miniaturization entails shrinking the size of individual semiconductor devices and crowding more semiconductor devices into a given unit area than has been previously achieved. With miniaturization, problems of device crowding arise. For example, problems of proper isolation between components arise. When miniaturization demands the shrinking of individual devices, isolation structures must also be reduced in size.

To form an isolation trench, a photoresist material is applied to a semiconductive material into which the isolation trench is to be formed, preferably by etching the semiconductive material. A beam of light, such as ultraviolet (UV) light, transfers a pattern through an imaging lens from a photolithographic template to the photoresist material. The pattern of the photolithographic template includes opaque and transparent regions with selected shapes that match corresponding openings and intact portions intended to be formed in the photoresist material. The photolithographic template is conventionally designed by computer-assisted drafting and is of a much larger size than the semiconductor structure on which the photoresist material is located. Light is directed through the photolithographic template and is focused on the photoresist coating in a manner that reduces the pattern of the photolithographic template to the size of the photolithographic coating and that develops the portions of the photoresist coating that are unmasked and are intended to remain. The undeveloped portions are thereafter easily removed. Other photolithographic techniques for formation of semiconductor structures are also possible. After the removal of the undeveloped portions of the photoresist material, the isolation trench is etched into the semiconductive material.

Isolation trenches and active areas are often doped, either to enhance conductivity around an isolation area, to increase the breakdown voltage (BV) of an active area diode which is adjacent to a field isolation trench, and/or to achieve a higher threshold voltage ($V_T$) of a parasitic field transistor.

For the fabrication of a complimentary metal oxide semiconductor (CMOS) device, ion implantation is used to form a preferred BV of an active area diode and a preferred $V_T$ a parasitic field transistor. The BV and $V_T$ are achieved by patterning a first mask on an N-well side of the CMOS device being fabricated. Next, dopant ions are implanted into the P-well portion of the device. Following dopant ion implantation of the P-well, the mask must be removed and the CMOS device must be patterned with a second mask on the P-well side of the CMOS device being fabricated. After patterning of the second mask, the N-well is implanted with dopant ions. This first and second mask technique is required to prevent the wrong type of dopant in each of the N-well and P-well of the CMOS device being fabricated.

The first and second mask process involves several steps which increase the possibility for fabrication errors entering into the process flow that will lower overall production yield. For example, where an isolation trench was formed by an anisotropic etch, a portion of the first mask is polymerized to begin to line the recess formed by the anisotropic etch. In such a case, stripping of the first photoresist may require a stronger stripping solution than would otherwise be needed. During photoresist polymerization, the polymerized photoresist may combine with other exposed portions of the semiconductor structure, such as contaminants, and thereby form a polymer composite film within the recess being formed. Such a polymer composite film resists stripping with conventional stripping solutions. A more effective stripping solution, however, that removes a polymer composite film will likely also cause undesirable topographies of the semiconductor structure that may compromise the integrity thereof.

What is needed is a method of ion implantation in a CMOS semiconductor structure being fabricated that achieves complimentary ion implantation with minimized masking steps in order to improve overall production yield. What is also needed is a method of CMOS fabrication that reduces destructive doping in N-well and P-well portions of a CMOS structure being fabricated while minimizing the number of masking steps.

SUMMARY OF THE INVENTION

The present invention relates to doping of a semiconductor structure using a minimal number of masks. By way of illustration, the present invention relates to the formation of trench isolation structures that isolate active areas, and relates to preferred doping in the fabrication of a CMOS device with use of a minimal number of masks. Other uses for the inventive method may include CMOS formation with field oxide regions used to separate active areas. The inventive method can be used in the fabrication or CMOS device including such structures as dynamic random-access memory (DRAM) structures, word line-activated transistors, and bipolar transistors.

In the inventive method, an isolation trench is formed in each of a P-well and an N-well, where the P-well and the N-well are situated in a semiconductor material. Each isolation trench extends below a top surface of the semiconductor material upon which is situated a pad oxide, a nitride layer, and a photoresist layer having a pattern therein through which an etchant anisotropically etched the semiconductor material so as to form the isolation trenches in each of the P-well and the N-well.

A first doping scheme is a doping of the semiconductor material with a P-type dopant, such as boron. The P-well and the N-well are both doped by ion implantation with the P-type dopant, which may include multiple doping steps. In the first doping scheme, the ions are implanted through the pad oxide, the nitride layer, and the photoresist layer into the semiconductor material. Ions that are implanted into the isolation trenches in each of the P-well and the N-well will implant deeper into the semiconductor material than ions that are implanted through the pad oxide, the nitride layer, and a photoresist layer.

The first doping scheme will preferably be two ion implantations that produce a first and a second P-type dopant concentration profile. The second P-type dopant concentration profile dopes active areas in each of the P-well and the N-well. Also, the second P-type dopant concentration profile has a beginning and ending that is deeper within the semiconductor material at comparable portions of the semiconductor material than that of the first P-type dopant concentration profile. As such, the first and second P-type dopant concentration profiles appears at differing levels at comparable portions of the semiconductor material due to the lesser energy of the first ion implantation compared to that of the second ion implantation. As such, the relative energy levels dictate the ability of the second ion implantation and the disability of the first ion implantation to penetrate through the pad oxide, the nitride layer, and the photoresist layer into the semiconductor material. The order of the first and second ion implantations can be reversed.

Following the second ion implantation, a thermal process is carried out to migrate implanted dopants into the semiconductor material, the effect of which is to flatten the first and second P-type dopant concentration profiles. A thermal oxide layer is grown in the isolation trenches of the P-well and N-well during the thermal process, and each isolation trench is filled with a dielectric material. A planarizing step then reduces the height of the structure. Next, the photoresist layer and the nitride layer are removed, leaving the dielectric material extending from each isolation trench above the pad oxide layer.

A second mask is formed over the P-well, leaving exposed the N-well of the CMOS device being fabricated. The second mask has a thickness that is selected to substantially resist ion penetration therethrough into the P-well. Next, a second doping scheme is carried out as a doping of the N-well with an N-type dopant, such as phosphorous. The second doping scheme dopes active areas adjacent to trenches in the N-well. A multiple number or ion implantations of variable energy are carried out in the doping of the N-well. As the N-well was doped with P-type dopants in the first doping scheme, the second doping scheme is sufficient to overcome the P-type dopant effect with N-type dopants. The first and second doping schemes will preferably assist in electrical isolation of active areas in each of the P-well and N-well so as to reduce leakage currents.

Energy of the implantations of the first and second doping schemes can be controlled to achieve a preferred voltage threshold ($V_T$) for a parasitic field transistor through selected dopant concentration profiles. For example, selected energies of the ion implantations can be designed to achieve a preferred trench wall and trench well implant concentration profiles, as well as a preferred deep junction implant concentration profile. Following preferred implantations, the second mask is removed as is the pad oxide layer, and a gate oxide layer in place thereof A process flow is then conducted so that the desired CMOS structure is completed.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to doping of a semiconductor structure using a minimal number of masks, and relates to the formation of an isolation trench that electrically isolates active areas in the fabrication of a CMOS device with a minimal number of masking steps. Other uses for the inventive method may include formation of field oxide regions that electrically isolate active areas. The inventive method can be used in the fabrication of CMOS devices including dynamic random-access memory (DRAM), word line-activated transistors, and bipolar transistors.

Figure 1:
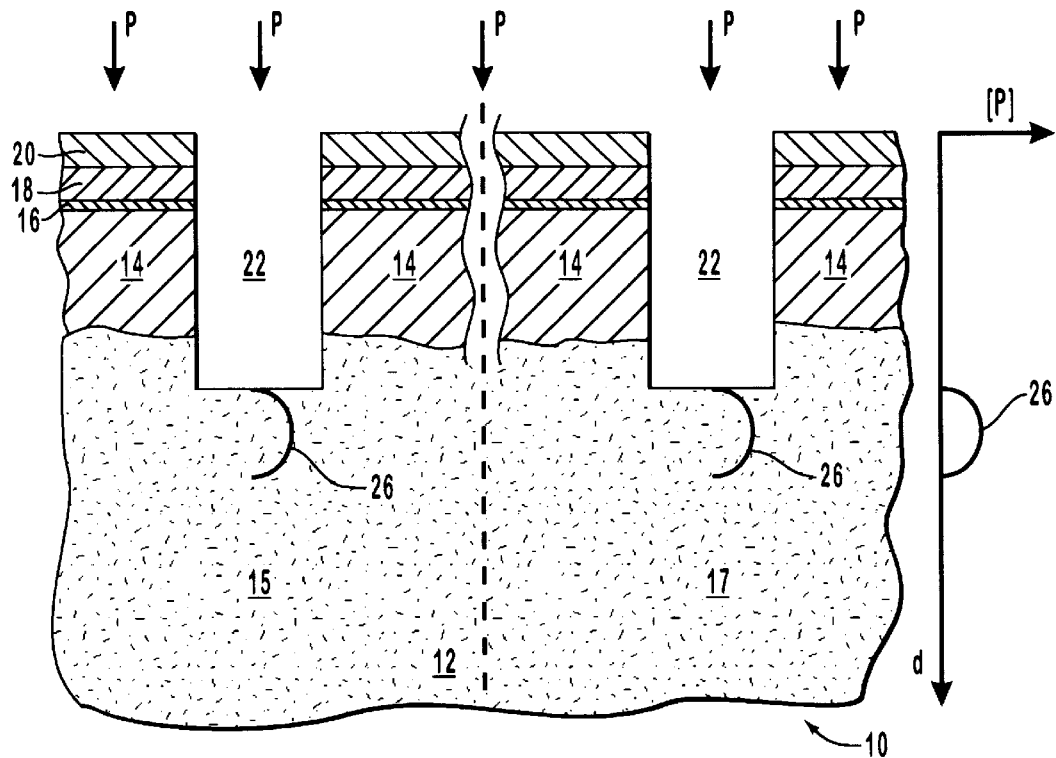
FIG. 1 is an elevational cross-section view of a semiconductor substrate having a P-well and an N-well therein each of which have an isolation trench therein, where P-type ion dopants are implanted in a first of two implanted in a first doping scheme though each of the isolation trenches into the respective P-well and N-well but not through layers situated upon the semiconductor substrate which include a pad oxide, a nitride layer and a photoresist patterned layer, and where a first P-type dopant concentration profile is illustrated at the bottom of the isolation trench in each of the P-well and the N-well, and furthermore illustrating a graph of dopant concentration as a function of depth in the semiconductor substrate for the P-type dopant concentration profiles at the bottom of the isolation trench in each of the P-well and the N-well.

FIG. 1 illustrates an elevational cross-section view of a semiconductor structure 10 that includes a semiconductor substrate 12 that is composed, for example, of single crystal silicon. Semiconductor substrate 12 is illustrated as having two sections divided into a P-well 15 and an N-well 17. Each of P-well 15 and N-well 17 has an active area 14 electrically isolated, respectively, by an isolation trench 22, 24. Upon active area 14 is a pad oxide layer 16 that has a nitride layer 18 disposed thereupon. Upon nitride layer 18, a mask 20 is patterned to exposed isolation trenches 22, 24. An etchant passes through openings in mask 20 to anisotropic etch isolation trenches 22, 24 in semiconductor substrate 12.

In a first doping step of a first doping scheme, downwardly-directed arrows represent P-type ions, such as boron, that are implanted beneath exposed isolation trenches 22, 24 in semiconductor substrate 12, but not through pad oxide layer 16 or nitride layer 18. As a result, a first P-type dopant concentration profile 26 has been formed. First P-type dopant concentration profile 26 is illustrated in FIG. 1 as a curve to reflect, both positionally within semiconductor substrate 12 and graphically, the non-linear or varying concentration of P-type dopant concentration as a function of depth within semiconductor substrate 12. Similarly, in FIGS. 2–4, dopant concentration profiles therein also reflect positional and quantitative representations of the implanted dopant.

Figure 2:
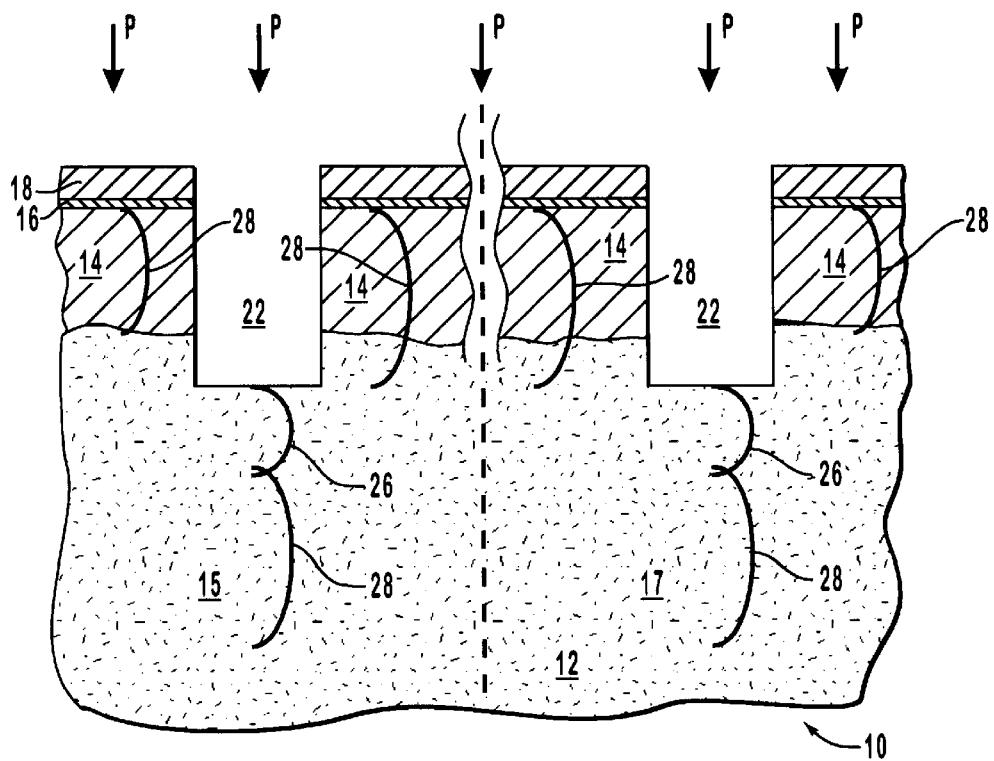
FIG. 2 is an elevational cross-section view of the semiconductor structure depicted in FIG. 1, wherein a second P-type ion implantation has been carried out for the first doping scheme, where the second P-type ion implantation penetrates the pad oxide, the nitride layer and the photoresist patterned layer so as to implant P-type dopant into both the P-well and the N-well so to form a second P-type dopant concentration profile below the first doping concentration profile at comparable locations below the isolation trenches, and also being formed beneath the pad oxide within both the P-well and the N-well.

FIG. 2 illustrates further processing according to the inventive method applied to the structure seen in FIG. 1, where mask 20 has been stripped, and a second P-type ion implantation of the first implant scheme has been made into both the P-well and the N-well. The energy of the second P-type ion implantation is sufficient to penetrate through pad oxide 16 and silicon nitride layer 18 into semiconductor substrate 12 and thereby form a second P-type dopant concentration profile 28. Second P-type dopant concentration profile 28 in P-well 15 functions as a P-well implant or an soft error rate barrier. Second P-type dopant concentration profile 28 appears substantially beneath first P-doping concentration profile 26 at the bottom of both isolation trenches 22, 24. As the first P-type ion implantation did not have sufficient energy to penetrate through pad oxide 16 and silicon nitride layer 18 into semiconductor substrate 12, only second P-type dopant concentration profile 28 appears within active area 14. There are two locations in semiconductor substrate that second P-doping concentration profile 28 appear, which are immediately below pad oxide layer 16 at a lesser depth than a second location beneath isolation trenches 22, 24. The two locations for second P-type dopant concentration profile 28 are due to the penetration of ions implanted in the first location through both nitride layer 18 and pad oxide layer 16 and the absence of such penetration by ions implanted in the second location. Additionally, the ions implanted in the second location began penetration into semiconductor substrate 12 deeper than the ions implanted in the first location due to the presence of isolation trenches 22, 24.

Figure 3:
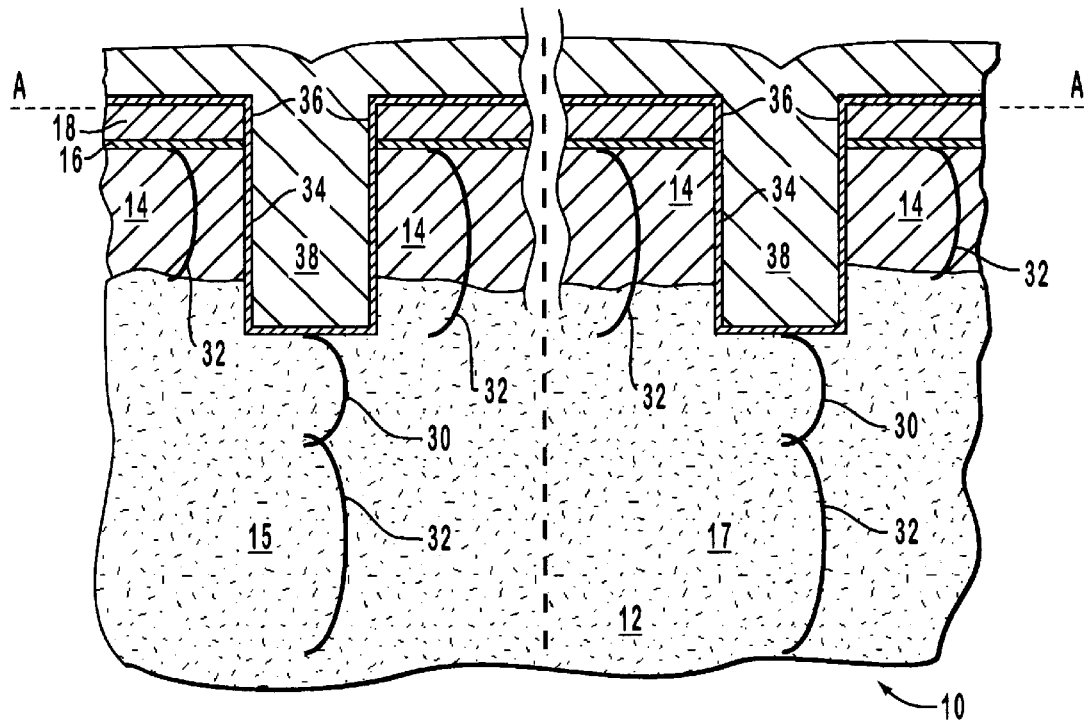
FIG. 3 is an elevational cross-section view of the semiconductor structure depicted in FIG. 2 after further processing, wherein the photoresist patterned layer has been stripped and a thermal process has caused an oxide and an optional oxynitride layer to form within the isolation trenches and upon the nitride layer, respectively, where the first and second P-type doping concentration profiles have flattened due to dopant migration during such thermal processing, where a dielectric material is illustrated as having been formed over the oxide and optional oxynitride layer to substantially fill the isolation trenches within both the P-well and the N-well, and wherein a level is indicated in phantom above which all material will be removed in a planarizing step.

FIG. 3 reflects the result of the structure seen in FIG. 2 being subject to a thermal process. It can be seen that first and second P-type dopant concentration profiles 26, 28 are substantially flattened compared with those depicted in FIGS. 1 and 2. This flattening of dopant concentration profiles illustrates the effect of dopant migration from the thermal process. It can be seen that first P-type dopant concentration profile 26 has formed a thermally adjusted first P-type dopant concentration profile 30, and second P-type dopant concentration profile 28 has formed a thermally adjusted second P-type dopant concentration profile 32.

A thermal oxide layer 34 has also formed within both P-well 22 and N-well 24. An optional thermal oxynitride layer 36 may also form upon nitride layer 18. The optional formation of optional thermal oxynitride layer 36 will depend upon the atmosphere, temperature, and duration of thermal processing conditions.

Following thermal processing, a dielectric material, for example silicon dioxide, is used to fill isolation trenches 22, 24 so as to form filled trenches 38. Silicon dioxide can be conventionally formed, such as by chemical vapor deposition using a tetraethylorthosilicate precursor. It can be seen that a filled trench 38 is formed, respectively, in isolation trench 22 in P-well 15, and insolation trench 17 in N-well trench 17. Next, a height reduction step, preferably a planarizing step such as chemical mechanical planarization is conducted at section line A—A seen in FIG. 3 so as to remove substantially all material extending above section line A—A. Another step is then conducted in which nitride layer 18 is removed from the surface of pad oxide 16. Nitride layer 18 and optional thermal oxynitride layer 36 are removed preferably by a phosphoric acid wet etch that has an etch recipe selective to oxides of silicon such as pad oxide 16 and filled trench 38. What remains of filled trench 38, thermal oxide layer 34, and optional thermal oxynitride layer 36 is isolation structure 40 seen in FIG. 4 which extends, respectively, from isolation trenches 22, 24 above an upper surface 52 of pad oxide 16. The distance that isolation structure 40 extends above upper surface 52 is dictated by the thickness of nitride layer 18 and the degree of selectivity of the nitride etch to the dielectric that forms filled trench 38 over nitride layer 18.

Figure 4:
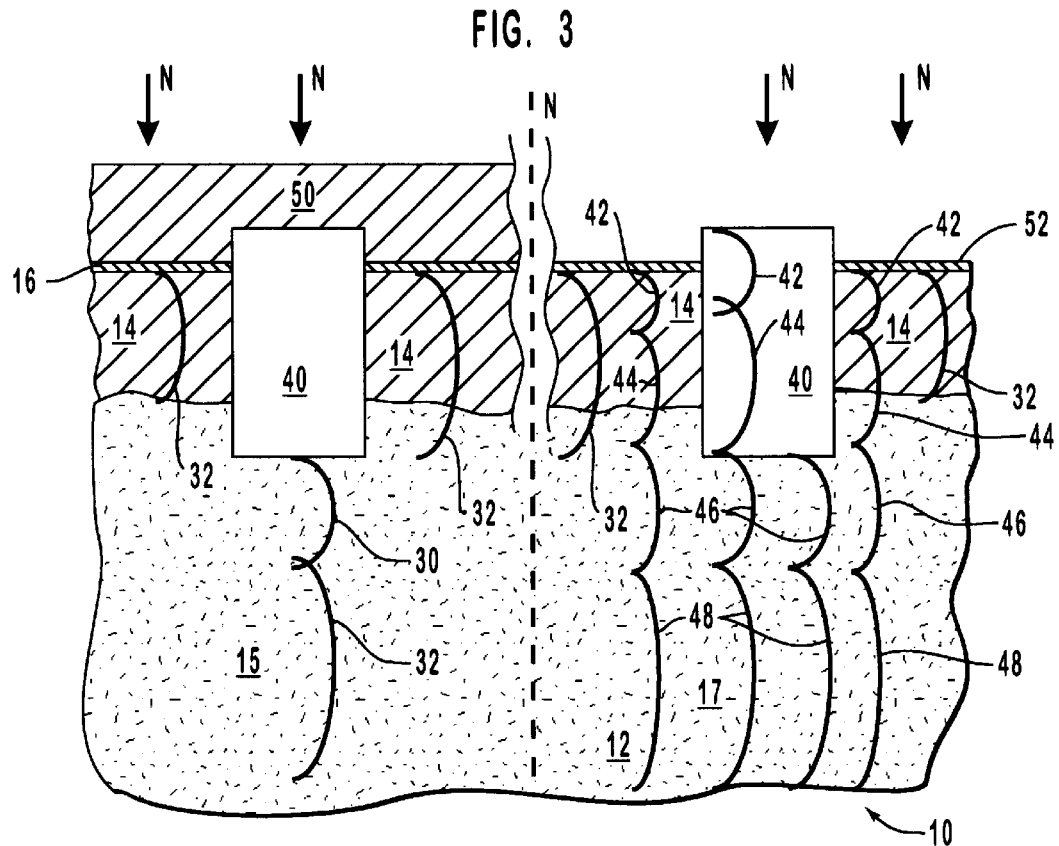
FIG. 4 is an elevational cross-section view of the semiconductor structure depicted in FIG. 3 after further processing, where the oxide, the optional oxynitride layer, and the nitride layer have been removed, where the P-well has been substantially covered with a mask to prevent ion implantation therein, wherein the N-well is exposed by the same mask, and wherein N-type ion dopants have been implanted into the N-well in a second doping scheme involving multiple ion implantation of varied energies so as to achieve within the N-well a doped active area, a doped trench wall and well, and a doped deep junction.

As seen in FIG. 4, a second mask 50 has been formed over the P-well 15, leaving N-well 17 exposed. Second mask 50 is selected from a thickness range that will substantially resist ions from penetrating therethrough. Preferably, second mask 50 has a thickness in a range from about 2 microns to about 6 microns, more preferably about 2.5 microns to about 5.5 microns, and most preferably about 3 microns to about 5 microns.

Second mask in then patterned as desired, such as by photolithography. Following patterning of second mask 50, a second doping scheme is undertaken. The second doping scheme involves N-type ion implantation, such as phosphorous ions, in multiple implantations of varying energy. Mask 50 prevents doping P-well 15 with N-type dopant, whereas N-well 17 is doped by the N-type ions implanted therein. The second doping scheme includes up to four N-type ion implantations in order to impart preferred properties.

In FIG. 4, it can be seen that four implants have been carried out in the second doping scheme. In the second doping scheme, P-well 15 of semiconductor substrate 12 has been substantially shielded from implantation due to the presence of second mask 50. As such, the P-type doping of P-well 15 of semiconductor substrate 12 is substantially unchanged following the second doping scheme. It is preferred that the second doping scheme prevent N-type dopants from penetrating through second mask 50 in a range from about 90 to 100 percent, more preferably from greater than 95 percent to about 100 percent, more preferably from greater than 99 percent to about 100 percent, and most preferably greater than 99.9 percent.

For N-well 17 of semiconductor substrate 12, several implantations each varying in energy may be carried out to achieve each of a preferred $V_T$ implant concentration profile 42, a preferred trench wall implant concentration profile 44, a preferred compensating trench well implant concentration profile 46, and a preferred compensating deep junction implant concentration profile 48 for the N region of semiconductor structure 10. Implant concentration profiles 42–48 are illustrated without being superimposed upon implant concentration profiles 30–32 for the sake of clarity. It is understood, however, that implant concentration profiles 42–48 are intermingled with implant concentration profiles 30–32 in N-well 17 of semiconductor substrate 12. Isolation structure 40 in N-well 17 is doped with N-type dopant from the second doping scheme, as seen by implant concentration profiles 42 and 44 therein. Doping within isolation structure 40 in N-well 17 will not significantly alter the dielectric properties thereof An etchant, however, may have a changed selectivity to the silicon dioxide within isolation structure 40 within N-well 17 have N-type doping due. Following preferred implantations, second mask 50 is stripped and pad oxide layer 16 is optionally removed in order to grow a gate oxide layer (not shown) in its place. Further process flow steps can then be performed to complete a CMOS device.

The effect of ion implantation will preferably strike a balance between overcoming P-type doping in N-well 17, and in forming a preferred N-type doping in N-well 17. N-type doping concentrations may exceed P-type doping concentrations in N-well 17 by as much as 100 times in order to overcome P-type doping therein as preferred.

To further illustrate an example of a preferred second doping scheme, it is known that the voltage threshold ($V_T$) for parasitic field transistors in N-well and P-well in a CMOS device, such as active areas 14, are preferred to have substantially comparable magnitudes for optimal logic-gate performance. In the present invention, the second doping scheme for N-well 17 requires a doping concentration that first neutralizes the effect of the P-type doping of the first P-doping scheme, and that then achieves a desired $V_T$ for parasitic field transistors in N-well 17 to about the same $V_T$ for parasitic field transistors in P-well 15.

The inventive method assists in the isolation of active areas by a preferred dopant concentration of implanted ions under the active areas being isolated. Also, the implantation techniques of the inventive method will preferably reduce leakage currents between the P-well and N-well. By implanting the P-well under both the active area and the isolation trench according to the inventive method, the soft error rate of a CMOS device, such as a memory cell, can be reduced. Additionally, the breakdown voltage for an active area diode and for an N-well diode is increased by ion implantation according to the inventive method.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. An electrical isolation method in a semiconductor substrate having therein a first well of a different conductivity than a second well in said semiconductor substrate, each of said second well and first well having therein a trench, wherein a primary concentration profile of a first-type dopant is beneath each of the trenches in the first well and the second well in said semiconductor substrate, wherein said first well and said second well are substantially undoped adjacent to the respective trenches by said first-type dopant, the method comprising:

forming a secondary concentration profile of said first-type dopant beneath each of the trenches in the first well and the second well;

forming a tertiary concentration profile of said first-type dopant adjacent to each of the trenches in the first well and the second well;

substantially filling the trench in each of the first well and second well within the semiconductor substrate with a dielectric material; and forming a concentration of a second-type dopant opposite in conductivity than said first-type dopant in the second well having a concentration of said second-type dopant that is substantially greater than the concentration of said first-type dopant, wherein said first well is substantially undoped by said second-type dopant.

2. The method as defined in claim 1, further comprising forming an active area in each of said first well and said second well, wherein said tertiary first-type dopant concentration profile is formed at least in part in an active area within said silicon substrate located adjacent to each of the trenches in the first well and the second well.

3. The method as defined in claim 1, wherein said secondary first-type dopant concentration profile extends deeper within the first well and second well than either of the primary and tertiary first-type dopant concentration profiles, and wherein said primary first-type dopant concentration profile extends deeper within the first well and second well than the tertiary first-type dopant concentration profile.

4. The method as defined in claim 1, further comprising heat treating the semiconductor substrate sufficient to migrate the first-type dopants of said primary, secondary, and tertiary first-type dopant concentration profiles.

5. The method as defined in claim 4, wherein heating the semiconductor substrate forms a thermal oxide layer within the trench in each of the first well and second well within the semiconductor substrate.

6. The method as defined in claim 1, wherein the semiconductor substrate below the trench in the second well has a concentration of second-type dopants that is at least ten times greater than that of first-type dopants.

7. The method as defined in claim 1, wherein the first-type dopant is substantially composed of boron and the second-type dopant is substantially composed of phosphorous.

8. The method as defined in claim 1, wherein:

forming said concentration of said second-type dopant comprises:

implanting ions of said second-type dopant into the second well, wherein said first well is substantially unimplanted by said ions of said second-type dopant;

forming a secondary concentration profile of said first-type dopant beneath each of the trenches in the first well and the second well comprises:

implanting ions of said first-type dopant into the semiconductor substrate beneath each of the trenches in the first well and the second well;

forming said tertiary concentration profile of said first-type dopant adjacent to each of the trenches in the first well and the second well comprises:

implanting said ions of said first-type dopant into the semiconductor substrate through at least one barrier layer on the semiconductor substrate into the first well and the second well adjacent to each of the trenches in the first well and the second well, wherein said secondary and tertiary first-type dopant concentration profiles are simultaneously formed; and wherein said primary concentration profile of said first-type dopant beneath each of the trenches in the first well and the second well in said semiconductor substrate is formed by implanting ions of said first-type dopant beneath each of the trenches in the first well and the second well, wherein said first well and said second well are substantially unimplanted by said ions of said first-type dopant adjacent to the respective trenches therein.

9. The method as defined in claim 8, further comprising:
forming said at least one barrier layer upon said semiconductor substrate;
forming a first mask having openings therein above each of the first well and the second well; and
forming said trench in each of the first well and second well within the semiconductor substrate through said openings in the first mask.

10. The method as defined in claim 9, wherein forming said trench in each of the first well and second well within the semiconductor substrate through said openings in the first mask comprises forming each said trench to extend to said at least one barrier layer.

11. The method as defined in claim 9, wherein said ions of said first-type dopant creating said primary first-type dopant concentration profile are implanted through openings in the first mask, and wherein said first mask substantially prevents said ions of said first-type dopant from implanting adjacent to the respective trenches in each of the first well and second well, the method further comprising removing the first mask prior to formation of said secondary first-type dopant concentration profile.

12. The method as defined in claim 9, further comprising patterning a second mask above the first well, wherein said second mask substantially prevents said ions of said second-type dopant from implanting said first well.

13. The method as defined in claim 12, wherein said second mask is patterned upon the dielectric material in the trench in the first well and upon the at least one barrier layer on the first well, and wherein said at least one barrier layers on the second well is exposed by said second mask.

14. The method as defined in claim 12, wherein said second mask is upon the at least one barrier layer on the first well, wherein said at least one barrier layer on the second well is exposed by said second mask, and wherein said ions of the second-type dopant are implanted through said at least one barrier layers on the second well into the dielectric material in the trench in the second well, the method further comprising removing the second mask.

15. The method as defined in claim 8, wherein said at least one barrier layer comprise:
a pad oxide upon a semiconductor substrate; and
a silicon nitride layer upon the pad oxide layer, wherein patterning said first mask exposes a portion of the silicon nitride layer above each of the first well and the second well, and wherein each said trench in said first well and second well extends to said pad oxide.

16. The method as defined in claim 15, further comprising removing the silicon nitride layer upon the pad oxide layer.

17. The method as defined in claim 8, wherein said ions of the second-type dopant are implanted through the at least one barrier layer on the second well into the dielectric material in the trench, into the second well beneath the trench, and into active areas in the second well adjacent to the trench, wherein said implanted second-type dopant ions create a plurality of second-type dopant concentration profiles, wherein said plurality of second-type dopant concentration profiles differ as to depth of extension within the second well and the dielectric material in the trench in the second well.

18. The method as defined in claim 17, wherein the plurality of second-type dopant concentration profiles are progressively deeper within the second well, and wherein the second-type dopant concentration in the second well substantially increases with the depth in the second well.

19. The method as defined in claim 8, wherein the ions of the second-type dopant are implanted into the semiconductor substrate to a depth deeper than that of the implanted ions of the first-type dopant.

20. The method as defined in claim 8, wherein said dielectric material extends above said at least one barrier layer.

21. An electrical isolation method in a semiconductor substrate having therein a first well of a different conductivity than a second well in said semiconductor substrate, each of said second well and first well having therein a trench, wherein a primary concentration profile of ions of a first-type dopant is implanted beneath each of the trenches in the first well and the second well in said semiconductor substrate, wherein said first well and said second well are substantially unimplanted adjacent to the respective trenches by ions of said first-type dopant, the method comprising:

forming an active area in each of said first well and said second well;

forming a secondary concentration profile of said first-type dopant beneath each of the trenches in the first well and the second well by implanting ions of said first-type dopant into the semiconductor substrate beneath each of the trenches in the first well and the second well;

forming a tertiary concentration profile of said first-type dopant adjacent to each of the trenches in the first well and the second well by implanting said ions of said first-type dopant into the semiconductor substrate through at least one barrier layer on the semiconductor substrate into the first well and the second well adjacent to each of the trenches in the first well and the second well, wherein said secondary and tertiary concentration profiles of said first-type dopant are simultaneously formed, wherein said tertiary concentration profile of said first-type dopant is formed at least in part in an active area within said silicon substrate located adjacent to each of the trenches in the first well and the second well;

substantially filling the trench in each of the first well and second well within the semiconductor substrate with a dielectric material, wherein said dielectric material extends above said at least one barrier layer; and forming a concentration of a second-type dopant opposite in conductivity than said first-type dopant in the second well implanting ions of said second-type dopant into the second well, wherein the ions of the second-type dopant are implanted into the semiconductor substrate to a depth deeper than that of the implanted ions of the first-type dopant, wherein said second well has a concentration of said second-type dopant that is at least ten times greater than the concentration of said first-type dopant, and wherein said first well is substantially undoped by said second-type dopant, wherein said secondary concentration profile of said first-type dopant extends deeper within the first well and second well than either of the primary and tertiary concentration profiles of said first-type dopant, and wherein said primary concentration profile of said first-type dopant extends deeper within the first well and second well than the tertiary concentration profile of said first-type dopant; and heat treating the semiconductor substrate sufficient to migrate the first-type dopants of said primary, secondary, and tertiary concentration profiles of said first-type dopant and sufficient to form a thermal oxide layer within the trench in each of the first well and second well within the semiconductor substrate.

22. The method as defined in claim 21, wherein the first-type dopant is substantially composed of boron and the second-type dopant is substantially composed of phosphorous.

23. The method as defined in claim 21, further comprising:

forming said at least one barrier layer upon said semiconductor substrate;

forming a first mask having openings therein above each of the first well and the second well; and forming said trench in each of the first well and second well within the semiconductor substrate through said openings in the first mask.

24. The method as defined in claim 23, wherein forming said trench in each of the first well and second well within the semiconductor substrate through said openings in the first mask comprises forming each said trench to extend to said at least one barrier layer.

25. The method as defined in claim 23, wherein said ions of said first-type dopant creating said primary first-type dopant concentration profile are implanted through openings in the first mask, and wherein said first mask substantially prevents said ions of said first-type dopant from implanting adjacent to the respective trenches in each of the first well and second well, the method further comprising removing the first mask prior to formation of said secondary first-type dopant concentration profile.

26. The method as defined in claim 23, further comprising patterning a second mask above the first well, wherein said second mask substantially prevents said ions of said second-type dopant from implanting said first well.

27. The method as defined in claim 26, wherein said second mask is patterned upon the dielectric material in the trench in the first well and upon the at least one barrier layer on the first well, and wherein said at least one barrier layers on the second well is exposed by said second mask.

28. The method as defined in claim 26, wherein said second mask is upon the at least one barrier layer on the first well, wherein said at least one barrier layer on the second well is exposed by said second mask, and wherein said ions of the second-type dopant are implanted through said at least one barrier layers on the second well into the dielectric material in the trench in the second well, the method further comprising removing the second mask.

29. The method as defined in claim 23, wherein said at least one barrier layer comprise:

a pad oxide upon a semiconductor substrate; and a silicon nitride layer upon the pad oxide layer, wherein patterning said first mask exposes a portion of the silicon nitride layer above each of the first well and the second well, and wherein each said trench in said first well and second well extends to said pad oxide.

30. The method as defined in claim 21, wherein said ions of the second-type dopant are implanted through the at least one barrier layer on the second well into the dielectric material in the trench, into the second well beneath the trench, and into active areas in the second well adjacent to the trench, wherein said implanted second-type dopant ions create a plurality of second-type dopant concentration profiles, wherein said plurality of second-type dopant concentration profiles differ as to depth of extension within the second well and the dielectric material in the trench in the second well.

31. The method as defined in claim 30, wherein the plurality of second-type dopant concentration profiles are progressively deeper within the second well, and wherein the second-type dopant concentration in the second well substantially increases with the depth in the second well.

32. A method of isolating a structure in a semiconductor substrate having therein a P-well and an N-well, each of said N-well and P-well having therein a trench, each said trench having implanted below and aligned therewith a first concentration profile of ions of a P-type dopant, and wherein said P-well and said N-well are substantially unimplanted by said ions of said P-type dopant adjacent to the respective trenches therein, the method comprising:

implanting ions in a second concentration profile of said P-type dopant into the semiconductor substrate beneath each of the trenches in the P-well and the N-well;

implanting ions in a third concentration profile of said P-type dopant though one or more barrier layers on the semiconductor substrate into the P-well and the N-well adjacent to each of the trenches in the P-well and the N-well, wherein said second and third concentration profiles of said P-type dopant are simultaneously formed;

substantially filling the trench in each of the P-well and N-well within the semiconductor substrate with a dielectric material; and implanting ions of an N-type dopant into the N-well, wherein said P-well is substantially unimplanted by said ions of said N-type dopant, and wherein the N-well has therein a concentration of said N-type dopant that is substantially greater than the P-type dopant concentration therein.

33. The method as defined in claim 32, further comprising forming an active area in each of said P-well and said N-well, wherein said third P-type dopant concentration profile is formed at least in part in an active area within said silicon substrate located adjacent to each of the trenches in the P-well and the N-well.

34. The method as defined in claim 32, further comprising:

forming said one or more barrier layers upon said semiconductor substrate;

forming a first mask having openings therein above each of the P-well and the N-well; and forming said trench in each of the P-well and N-well within the semiconductor substrate through said openings in the first mask, wherein each said trench extends to said one or more barrier layers.

35. The method as defined in claim 34, wherein said ions of said P-type dopant creating said first concentration profile of said P-type dopant are implanted through openings in the first mask, and wherein said first mask substantially prevents said ions of said P-type dopant from implanting adjacent to the respective trenches in each of the P-well and N-well, the method further comprising removing the first mask prior to formation of said second concentration profile of said P-type dopant.

36. The method as defined in claim 32, further comprising patterning a second mask above the P-well, wherein said second mask substantially prevents said ions of said N-type from implanting said P-well.

37. The method as defined in claim 36, wherein said second mask is patterned upon the dielectric material in the trench in the P-well and upon the one or more barrier layers on the P-well, and wherein said one or more barrier layers on the N-well being exposed by said second mask.

38. The method as defined in claim 36, wherein said second mask is upon the one or more barrier layers on the P-well, wherein said one or more barrier layers on the N-well is exposed by said second mask, and wherein said ions of the N-type dopant are implanted through said one or more barrier layers on the N-well into the dielectric material in the trench in the N-well, the method further comprising removing the second mask.

39. The method as defined in claim 32, wherein said second concentration profile of said P-type dopant extends deeper within the P-well and N-well than either of the first and third concentration profiles of said P-type dopant, and wherein said first concentration profile of said P-type dopant extends deeper within the P-well and N-well than the third concentration profile of said P-type dopant.

40. The method as defined in claim 32, further comprising heat treating the semiconductor substrate sufficient to migrate the P-type dopants of said first, second, and third concentration profiles of said P-type dopant.

41. The method as defined in claim 40, wherein heating the semiconductor substrate forms a thermal oxide layer within the trench in each of the P-well and N-well within the semiconductor substrate.

42. The method as defined in claim 32, wherein said dielectric material extends above said one or more barrier layers.

43. The method as defined in claim 34, wherein said one or more barrier layers comprise:
a pad oxide upon a semiconductor substrate; and
a silicon nitride layer upon the pad oxide layer, wherein patterning said first mask exposes a portion of the silicon nitride layer above each of the P-well and the N-well, and wherein each said trench in said P-well and N-well extends to said pad oxide.

44. The method as defined in claim 43, further comprising removing the nitride layer upon the pad oxide layer.

45. The method as defined in claim 32, wherein said ions of the N-type dopant are implanted through the one or more barrier layers on the N-well into the dielectric material in the trench, into the N-well beneath the trench, and into active areas in the N-well adjacent to the trench, wherein said implanted N-type dopant ions create a plurality of N-type dopant concentration profiles, wherein said plurality of N-type dopant concentration profiles differ as to depth of extension within the N-well and the dielectric material in the trench in the N-well.

46. The method as defined in claim 45, wherein the plurality of N-type dopant concentration profiles are progressively deeper within the N-well, and wherein the N-type dopant concentration in the N-well substantially increases with the depth in the N-well.

47. The method as defined in claim 32, wherein the semiconductor substrate below the trench in the N-well has implanted thereat a concentration of N-type dopants that is at least ten times greater than that of P-type dopants.

48. The method as defined in claim 32, wherein the P-type dopant is substantially composed of boron and the N-type dopant is substantially composed of phosphorous.

49. The method as defined in claim 32, wherein the ions of the N-type dopant are implanted into the semiconductor substrate to a depth deeper than that of the implanted ions of the P-type dopant.

50. A method of doping an isolation trench comprising:
implanting ions of a P-type dopant into a semiconductor substrate having therein a P-well and an N-well, each of said N-well and P-well having therein an active area and a trench, said ions of said P-type dopant being implanted beneath each of the trenches in the P-well and the N-well to create a first P-type dopant concentration profile in said semiconductor substrate, wherein said P-well and said N-well are substantially unimplanted by said ions of said P-type dopant adjacent to the respective trenches therein;
implanting ions of a P-type dopant into the semiconductor substrate:
beneath each of the trenches in the P-well and the N-well to form a second P-type dopant concentration profile; and
though one or more barrier layers on the semiconductor substrate into the P-well and the N-well adjacent to each of the trenches in the P-well and the N-well to form a third P-type dopant concentration profile, wherein:
said third P-type dopant concentration profile is formed at least in part in the active area within said silicon substrate located adjacent to each of the trenches in the P-well and the N-well;
said second and third P-type dopant concentration profiles are simultaneously formed;
said second P-type dopant concentration profile extends deeper within the P-well and N-well than either of the first and third P-type dopant concentration profiles; and
said first P-type dopant concentration profile extends deeper within the P-well and N-well than the third dopant P-type concentration profile;
substantially filling the trench in each of the P-well and N-well within the semiconductor substrate with a dielectric material; and
implanting ions of an N-type dopant into the N-well, wherein said P-well is substantially unimplanted by said ions of said N-type dopant, and wherein the N-well has therein a concentration of said N-type dopant that is at least ten time greater than the P-type dopant concentration therein.

51. The method as defined in claim 50, further comprising the steps of:
forming said one or more barrier layers upon said semiconductor substrate;
forming a first mask having openings therein above each of the P-well and the N-well;
forming said trench in each of the P-well and N-well within the semiconductor substrate through said openings in the first mask, wherein each said trench extends to said one or more barrier layers; and
removing the first mask prior to formation of said second P-type dopant concentration profile; and wherein:

said ions of said P-type dopant creating said first P-type dopant concentration profile are implanted through said openings in the first mask; and said first mask substantially prevents said ions of said P-type dopant from implanting adjacent to the respective trenches in each of the P-well and N-well.

52. The method as defined in claim 50, further comprising patterning a second mask above the P-well, wherein said second mask substantially prevents said ions of said N-type from implanting said P-well.

53. The method as defined in claim 52, wherein said second mask is patterned upon the dielectric material in the trench in the P-well and upon the one or more barrier layers on the P-well, and wherein the one or more barrier layers on the N-well are exposed by said second mask.

54. The method as defined in claim 52, wherein said second mask is upon the one or more barrier layers on the P-well, wherein said one or more barrier layers on the N-well is exposed by said second mask, and wherein said ions of the N-type dopant are implanted through said one or more barrier layers on the N-well into the dielectric material in the trench in the N-well, the method further comprising removing the second mask.

55. The method as defined in claim 50, further comprising heat treating the semiconductor substrate sufficient to migrate the P-type dopants of said first, second, and third P-type dopant concentration profiles, wherein heating the semiconductor substrate forms a thermal oxide layer within the trench in each of the P-well and N-well within the semiconductor substrate.

56. The method as defined in claim 50, wherein said ions of the N-type dopant are implanted through the one or more barrier layers on the N-well into the dielectric material in the trench, into the N-well beneath the trench, and into active areas in the N-well adjacent to the trench, wherein said implanted N-type dopant ions create a plurality of N-type dopant concentration profiles, wherein said plurality of N-type dopant concentration profiles differ as to depth of extension within the N-well and the dielectric material in the trench in the N-well.

57. The method as defined in claim 56, wherein the plurality of N-type dopant concentration profiles are progressively deeper within the N-well, and wherein the N-type dopant concentration in the N-well substantially increases with the depth in the N-well.

58. The method as defined in claim 50, wherein the ions of the N-type dopant are implanted into the semiconductor substrate to a depth deeper than that of the implanted ions of the P-type dopant.

59. A method of forming an isolation trench in each of a P-well and an N-well in a semiconductor substrate, comprising:

providing a semiconductor substrate having therein a P-well and an N-well;

forming a pad oxide upon a semiconductor substrate;

forming a nitride layer upon the pad oxide layer;

patterning a first mask upon the nitride layer to expose a portion thereof above each of the P-well and the N-well;

forming a trench in each of the P-well and N-well within the semiconductor substrate through the exposed portions of the nitride layer above each of the P-well and the N-well, each said trench extending to said pad oxide;

implanting ions of a P-type dopant into the semiconductor substrate beneath each of the trenches in the P-well and the N-well to create a first P-type dopant concentration profile in said semiconductor substrate, wherein said first mask substantially prevents ions from implanting adjacent to the respective trenches in each of the P-well and N-well;

removing the first mask;

implanting ions of a P-type dopant into the semiconductor substrate:

beneath each of the trenches in the P-well and the N-well to form a second P-type dopant concentration profile; and though said pad oxide and said nitride layer into the P-well and the N-well adjacent to each of the trenches in the P-well and the N-well to form a third P-type dopant concentration profile in an active area within said silicon substrate located adjacent to each of the trenches in the P-well and the N-well, wherein said second and third P-type dopant concentration profiles are simultaneously formed, wherein said second P-type dopant concentration profile extends deeper within the P-well and N-well than either of the first and third P-type dopant concentration profiles, and wherein said first P-type dopant concentration profile extends deeper within the P-well and N-well than the third dopant P-type concentration profile;

heat treating the semiconductor substrate sufficient to migrate the P-type dopants of said first, second, and third P-type dopant concentration profiles, and to form a thermal oxide layer within the trench in each of the P-well and N-well within the semiconductor substrate;

removing the nitride layer upon the pad oxide layer;

patterning a second mask upon the dielectric material and upon the pad oxide on the P-well, said pad oxide on the N-well being exposed by said second mask; and implanting ions of an N-type dopant through the pad oxide on the N-well to create a plurality of N-type dopant concentration profiles differing as to depth of extension within the N-well; wherein said second mask substantially prevents N-type ions from implanting said P-well, and wherein the N-well has a concentration of said N-type dopant substantially greater than the P-type dopant therein.

60. The method as defined in claim 59, further comprising:

substantially filling the trench in each of the P-well and N-well within the semiconductor substrate with a dielectric material, said dielectric material extending above the nitride layer;

removing the second mask;

densifying the pad oxide layer;

removing the pad oxide layer; and forming a gate oxide layer upon said semiconductor substrate.

61. The method as defined in claim 59, wherein the N-well has a concentration of said N-type dopant that is substantially greater than the P-type dopant therein.

62. The method as defined in claim 59, wherein the P-type dopant is substantially composed of boron and the N-type dopant is substantially composed of phosphorous.

63. The method as defined in claim 59, wherein the ions of the N-type dopant are implanted into the semiconductor substrate to a depth deeper than that of the implanted ions of the P-type dopant.

64. The method as defined in claim 59, wherein the semiconductor substrate below the trench in the N-well has implanted thereat a concentration of N-type dopants that is at least ten times greater than that of P-type dopants.

65. The method as defined in claim 59, wherein implanting ions of the N-type dopant implants said N-type dopant ions into the dielectric material in the trench in the N-well, into the N-well beneath the trench, and into active areas in the N-well adjacent to the trench in the N-well.

66. The method as defined in claim 59, wherein the plurality of N-type dopant concentration profiles are progressively deeper within the N-well, and wherein the N-type dopant concentration in the N-well substantially increases with the depth in the N-well.

67. A method of doping a semiconductor device, comprising:

directing ions of a first type toward said semiconductor device;

directing ions of a second type toward said semiconductor device; and protecting a portion of said semiconductor device from said ions of said second type.

68. A method of doping a CMOS device having a first active area, a second active area, and at least one protective layer over said first and second active areas, the method comprising:

initiating a first implantation stage of a first type of ions onto said CMOS device;

removing said at least one protective layer;

initiating a second implantation stage of said first type of ions onto said CMOS device;

providing said first active area with an additional protective layer; and initiating a first implantation stage of a second type of ions onto said CMOS device.

69. The method as defined in claim 68, wherein initiating said first implantation stage of said first type of ions onto said CMOS device further comprises:

implanting said first type of ions over generally the entire CMOS device.

70. The method as defined in claim 68, wherein initiating said second implantation stage of said first type of ions onto said CMOS device further comprises:

implanting said first type of ions over generally the entire CMOS device.

* * * * *